United States Patent [19]
Zaitsu

[11] Patent Number: 5,969,954
[45] Date of Patent: Oct. 19, 1999

[54] AC/DC CONVERTER WITH A PIEZOELECTRIC TRANSFORMER

[75] Inventor: Toshiyuki Zaitsu, Tokyo, Japan

[73] Assignee: NEC Corporation, Tokyo, Japan

[21] Appl. No.: 09/007,571

[22] Filed: Jan. 15, 1998

[30] Foreign Application Priority Data

Jan. 16, 1997 [JP] Japan ................................. 9-017806

[51] Int. Cl.⁶ .......................... H02M 3/335; H01L 41/08
[52] U.S. Cl. ............................ 363/16; 310/319; 310/359
[58] Field of Search ................................. 363/15, 16, 17,
363/95, 98, 131, 132; 310/315, 316, 318,
319, 359, 366

[56] References Cited

U.S. PATENT DOCUMENTS

| | | | |
|---|---|---|---|
| 5,329,200 | 7/1994 | Zaitsu | 310/316 |
| 5,504,668 | 4/1996 | Beyerlein et al. | 363/95 |
| 5,548,189 | 8/1996 | Williams | 315/224 |
| 5,654,605 | 8/1997 | Kawashima | 310/316 |
| 5,705,877 | 1/1998 | Shimada | 310/318 |
| 5,736,807 | 4/1998 | Hakamata et al. | 310/359 |
| 5,751,092 | 5/1998 | Abe | 310/359 |
| 5,768,111 | 6/1998 | Zaitsu | 363/15 |

FOREIGN PATENT DOCUMENTS 6-245548  9/1994  Japan .
7-39144   2/1995  Japan .

Primary Examiner—Adolf Deneke Berhane
Attorney, Agent, or Firm—Scully, Scott Murphy & Presser

[57] ABSTRACT

An AC/DC converter of the present invention includes a transformer implemented by a piezoelectric transformer. Power fed from a commercially available power source (14) is converted to a DC voltage by rectification and smoothing. The DC voltage is transformed to a high frequency (about 100 kHz) pulse voltage by switching FETs (Field Effect Transistors) (5) and (6). The pulse voltage is applied to the input of a piezoelectric transformer (9). The transformer (9) has its vibration mode and dimension selected such that the resonance frequency of the transformer is substantially identical with the frequency of the above pulse wave. A high frequency AC voltage is produced from the output side of the transformer (9). The AC voltage is transformed to a DC voltage by rectification and smoothing and then fed to a load resistor (13). The piezoelectric transformer is easy to miniaturize, compared to an electromagnetic transformer. The entire AC/DC converter can therefore be reduced in size.

22 Claims, 7 Drawing Sheets

LONGITUDINAL VIBRATION MODE

TRANSVERSE VIBRATION MODE

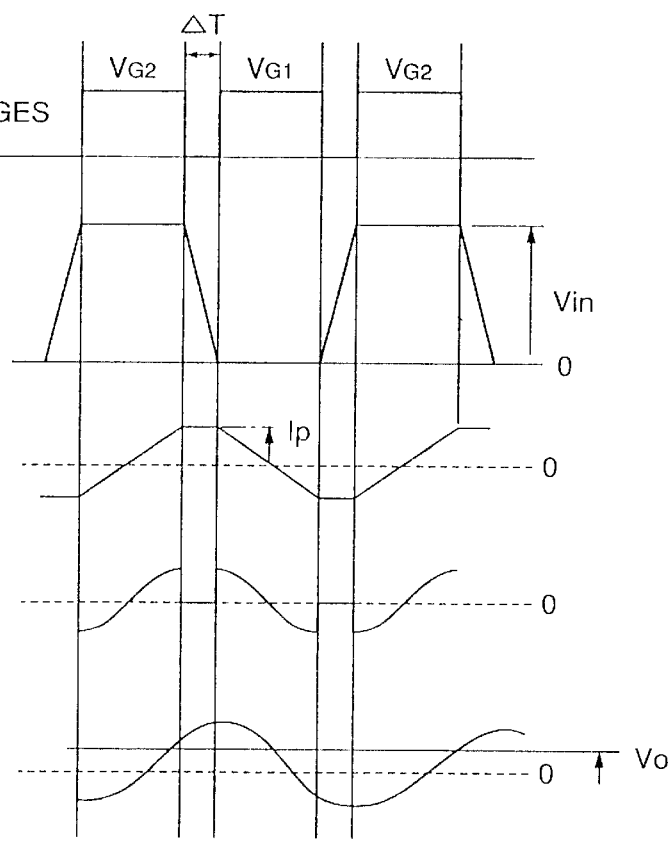
FIG.4A GATE VOLTAGES TO FETs 5&6
FIG.4B Vds
FIG.4C iLr
FIG.4D is
FIG.4E Vd

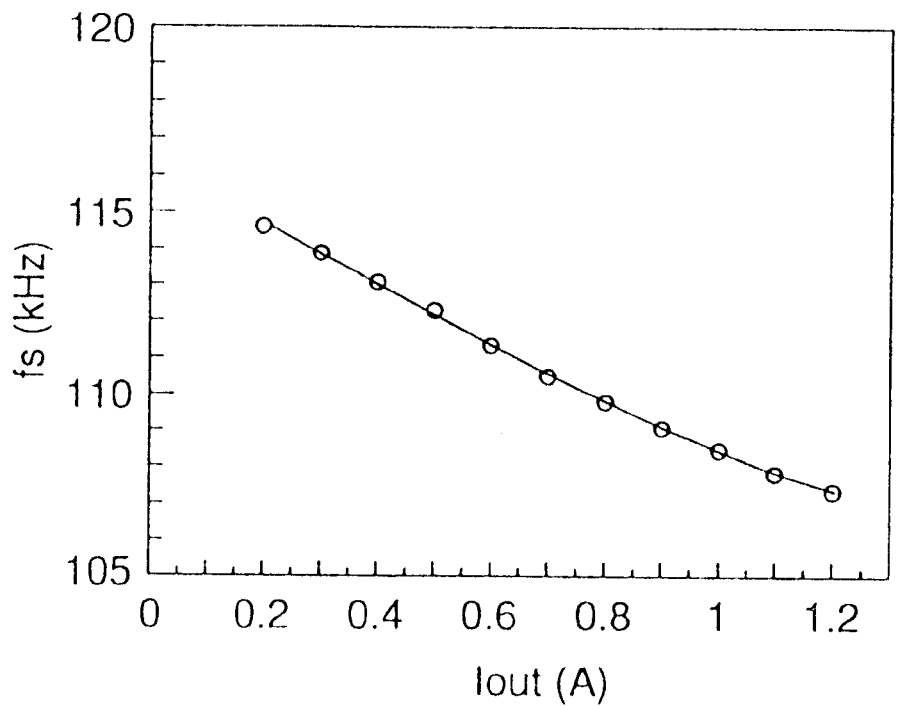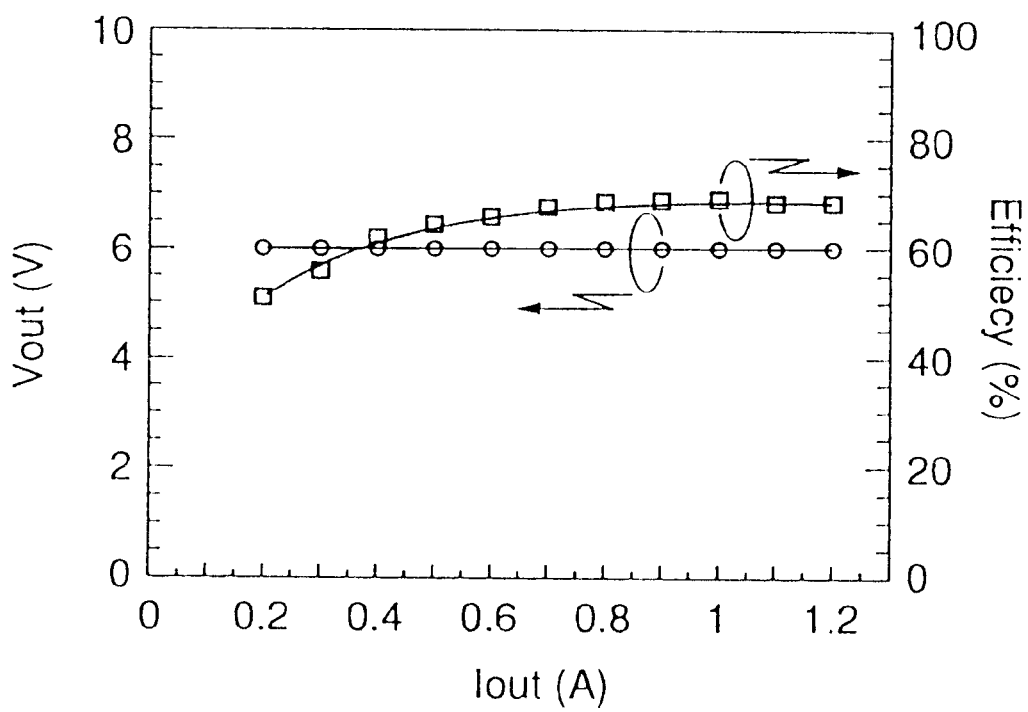
FIG.7

AC/DC CONVERTER WITH A PIEZOELECTRIC TRANSFORMER

BACKGROUND OF THE INVENTION

The present invention relates to an AC/DC converter for converting a commercially available AC power source to a desired DC output and, more particularly, to an AC/DC converter advantageously usable as an AC adapter for household electrical appliances including a notebook type personal computer.

An AC/DC converter for the above application is usually implemented by a switching regulator system and includes an electromagnetic transformer and a switching circuit operable at about 100 kHz by high frequency noise regulation (VCCI, FCC). Japanese Patent Laid-Open Publication No. 6-245548 teaches an inverter circuit for outputting a high voltage adapted for the liquid crystal backlight of, e.g., a notebook type personal computer. The inverter circuit taught in this document uses a piezoelectric transformer which is small size and light weight and has a high boosting ratio. Japanese Patent Laid-Open Publication No. 7-39144 discloses a DC/DC converter using a piezoelectric transformer operable in a thickness-extensional vibration mode and resonating in a megahertz frequency band.

A conventional AC/DC converter uses an electromagnetic transformer for outputting a desired DC voltage. The electromagnetic transformer is required to have its primary winding and secondary winding spaced by a prescribed distance for insulation from the safety standpoint. Such a distance for insulation obstructs the miniaturization of the transformer. By contrast, a piezoelectric transformer is formed of ceramics and therefore small size, incombustible, highly isolative, and high frequency, high power efficiency, boosting ratio, and high power density. With these features, a piezoelectric transformer is implemented as an inverter circuit for outputting a high voltage adapted for a liquid crystal backlight or as a DC/DC converter. On the other hand, for a high voltage inverter, it is a common practice to use a Rosen type piezoelectric transformer. This type of transformer outputs a current of only several milliamperes and is not applicable to an AC/DC converter required to output a current of several amperes. The piezoelectric transformer operable in the thickness-extensional vibration mode and used as a DC/DC converter operates in the megahertz frequency band uses an electrolytic capacitor for a smoothing purpose. This kind of transformer is not feasible for an AC/DC converter due to the electrolytic capacitor and because the AC/DC converter must operate in substantially the 100 kHz frequency band. For the above reasons, applying a piezoelectric transformer to an AC/DC converter which transforms a commercial AC power source to a DC output has not been considered.

SUMMARY OF THE INVENTION

It is therefore an object of the present invention to provide a small size, light weight AC/DC converter for transforming a commercial AC power source to a DC output.

It is another object of the present invention to provide a switching regulator type AC/DC converter capable of switching in an about 100 kHz frequency band and implemented by a piezoelectric transformer.

An AC/DC converter of the present invention includes a piezoelectric transformer. The piezoelectric transformer has its dimension and vibration mode selected such that the transformer is in the about 100 kHz frequency band. The transformer has electrodes laminated in such a manner as to implement a great output current at a high efficiency.

BRIEF DESCRIPTION OF THE DRAWINGS

The above and other objects, features and advantages of the present invention will become apparent from the following detailed description when taken with the accompanying drawings in which:

FIGS. 4A–4E show specific waveforms demonstrating the operation of a switching section and the piezoelectric transformer of the illustrative embodiment;

FIG. 7 shows a load variation characteristic particular to the embodiment shown in FIG. 6;

Figure 1:
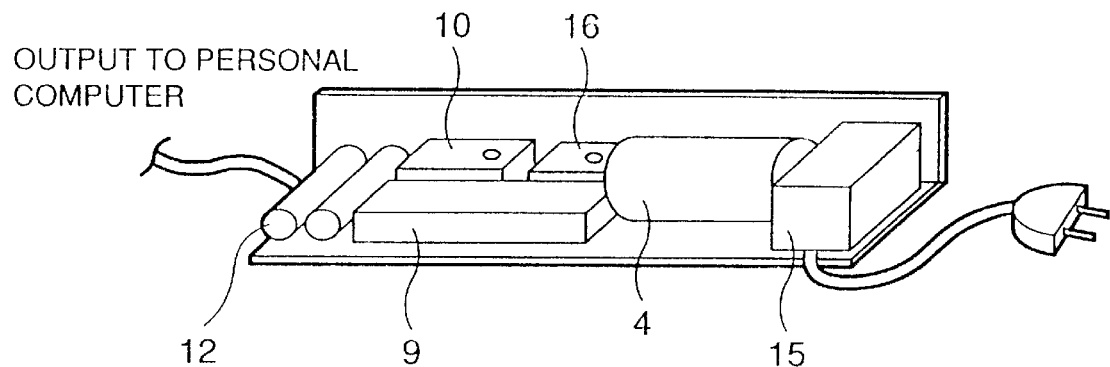
FIG. 1 is a perspective view showing an AC/DC converter embodying the present invention.

In the drawings, identical references denote identical structural elements.

DETAILED DESCRIPTION OF THE PREFERRED EMBODIMENTS

Figure 2:
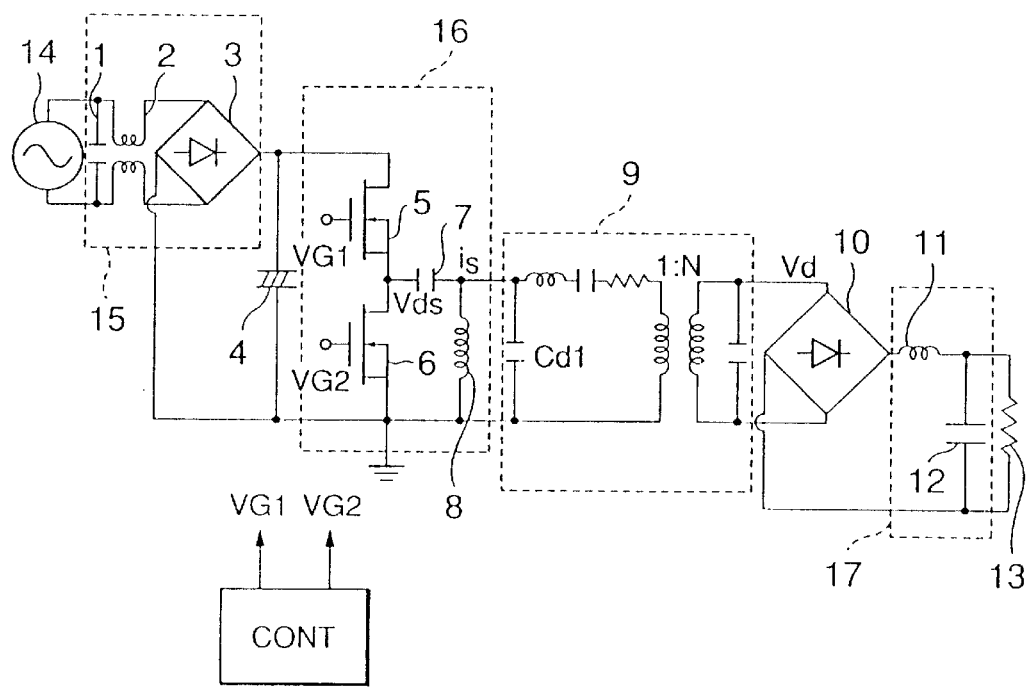
FIG. 2 is a circuit diagram representative of the AC/DC converter shown in FIG. 1.
Figure 3A:
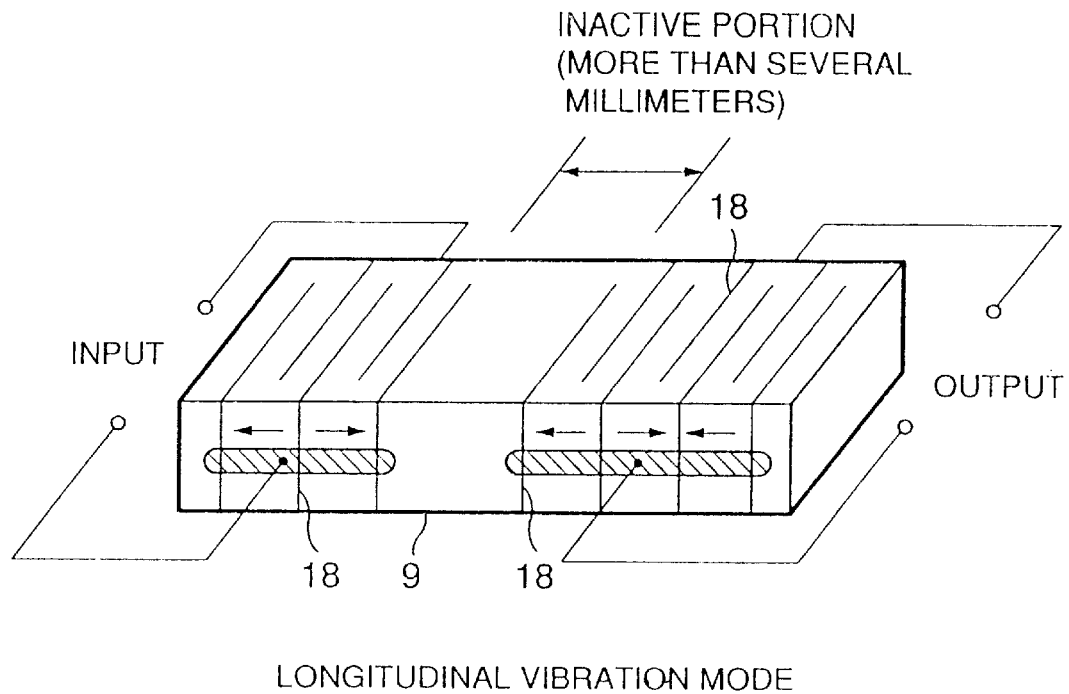
FIGS. 3A and 3B each shows a specific configuration of a piezoelectric transformer included in the AC/DC converter shown in FIG. 1.
Figure 3B:
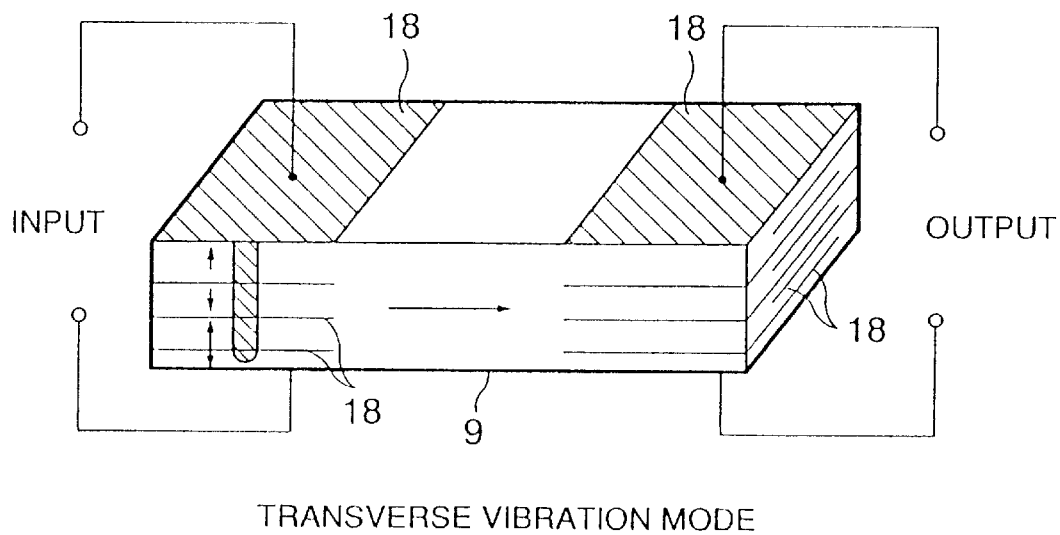

Referring to FIG. 1 of the drawings, an AC/DC converter embodying the present invention and using a piezoelectric transformer is shown in a perspective view. FIG. 2 is a circuit diagram showing the AC/DC converter. Specific configurations of the piezoelectric transformer are shown in FIGS. 3A and 3B. As shown, power is fed to the AC/DC converter from a commercially available 50 Hz or 60 Hz, 100 V AC power source 14. An input filter 15 is made up of a filter capacitor 1, a common choke coil 2, and a diode bridge 3 for rectification. The input filter 15 and an input smoothing filter capacitor 4 convert the input power to a pulse voltage close to DC. A switching section 16 is made up of FET (Field Effect Transistor) switches 5 and 6, a capacitor 7 for cutting a DC bias, and an inductor 8 for resonance. The switching section 16 transforms the above pulse voltage to a high frequency (about 100 kHz) pulse wave. The pulse wave is applied to the input side of a piezoelectric transformer 9. The piezoelectric transformer 9 has a length determined such that the resonance frequency of the transformer 9 substantially coincides with the frequency (about 100 kHz) of the pulse wave. Generally, in a longitudinal vibration the resonance frequency of a piezoelectric transformer is inversely proportional to the length of the transformer. A transformed high frequency (about 100 kHz) AC voltage appears on the output side of the transformer 9. A diode bridge 10, an output smoothing choke coil 11 and an output smoothing capacitor 12 constitute an output smoothing filter section 17. The output smoothing filter section 17 rectifies and smooths the AC voltage output from the transformer 9, thereby producing a DC voltage. The DC voltage is fed to a load resistor 13.

As shown in FIG. 3A, the piezoelectric transformer 9 has an input section and an output section each being implemented by a group of electrodes 18. Each group of electrodes 18 are laminated in the lengthwise direction of the transformer 9 and connected in parallel with each other. Portions between the electrodes 18 are polarized in the lengthwise direction, as indicated by arrows in FIG. 3A. This type of transformer 9 is excited in a longitudinal vibration mode. FIG. 3B shows an alternative configuration of the transformer 9. As shown, each group of electrodes 18 are laminated in the thicknesswise direction of the transformer 9 and connected in parallel with each other. At each of the input section and output section, portions between the electrodes 18 are polarized in the thicknesswise direction of the transformer 9, as indicated by arrows in FIG. 3B. In addition, a portion between the input section and the output section is polarized in the lengthwise direction of the transformer 9. This type of transformer 9 is excited in a transverse vibration mode. With any of the configurations shown in FIGS. 3A and 3B, the transformer 9 can output a great current with a relatively low resonance frequency (about 100 kHz).

A specific operation of the switching section and piezoelectric transformer will be described with reference to FIGS. 4A–4E. As shown, a controller (CONT) causes gate voltages VG1 and VG2 to be alternately input to the gate electrodes of the FETs 5 and 6, respectively, at the intervals of a dead time ΔT. As a result, the FETs 5 and 6 turn on alternatively. During the dead time ΔT, the transformer 9 completes the charge or the discharge of its input capacity $C_{d1}$ in response to the peak value Ip of a current iLr flowing through the resonance inductor 8. An AC output voltage Vd appearing on the output electrode of the transformer 9 is determined by the voltage gain of the transformer 9. On the other hand, the voltage gain of the transformer 9 varies with the variation of the switching frequency or the resistance of the load resistor 13 due to the resonance characteristic of the transformer 9. Therefore, the size of an AC voltage Vd output from the transformer 9 can be controlled by, e.g., varying the switching frequency.

Figure 5:
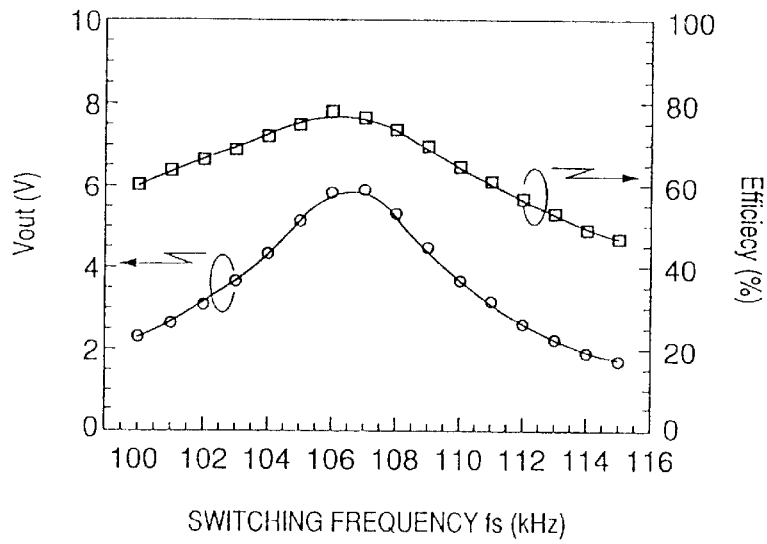
FIG. 5 shows a switching frequency to output characteristic and a power conversion efficiency characteristic achievable with the illustrative embodiment.

FIG. 5 shows a DC output voltage characteristic and a power transform efficiency characteristic determined when the AC input voltage was about 100 V, the maximum DC output voltage was about 6 V, and the switching frequency was varied between 100 kHz and 115 kHz. As shown, the DC output voltage is variable over a range of from about 2 V to about 6V. Also, a power conversion efficiency of about 50% to about 80% is achievable.

Figure 6:
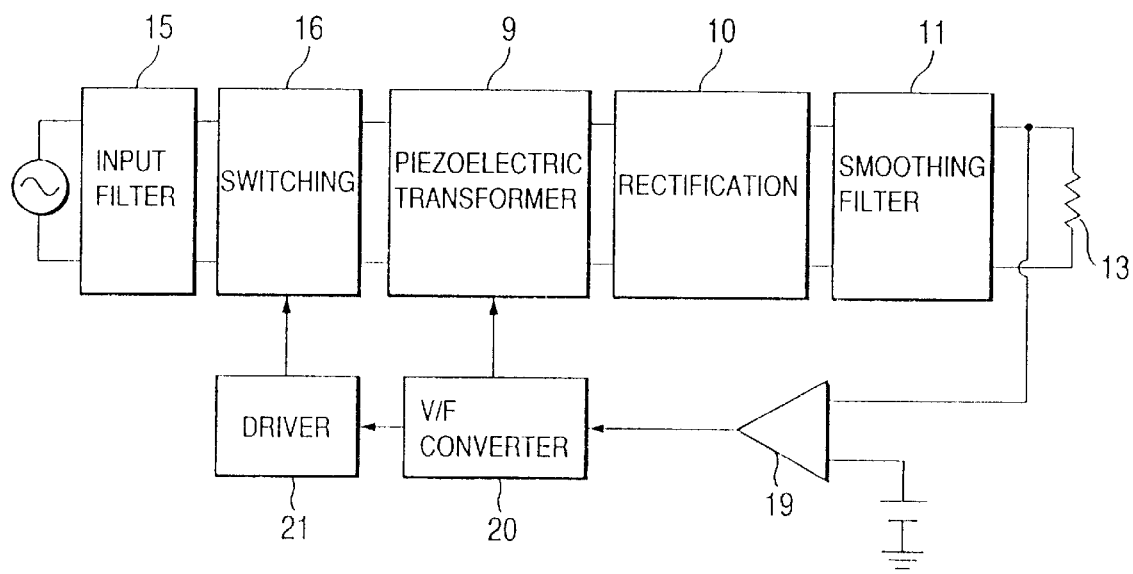
FIG. 6 is a block diagram schematically showing an alternative embodiment of the present invention.

FIG. 6 shows an alternative embodiment of the present invention which includes control means for maintaining the DC output voltage constant without regard to the variation of a load. As shown, the DC voltage output from the output smoothing filter 11 is input to an error amplifier 19. The error amplifier 19 amplifies a voltage representative of a difference between the input DC voltage and a preselected voltage and delivers the amplified voltage to a voltage/frequency (V/F) converter 20. The V/F converter 20 outputs a signal whose frequency corresponds to the input voltage and feeds it to a driver 21. The driver 21 controls the switching frequency of the switching 16 on the basis of the frequency of the input signal.

FIG. 7 shows that when the load current varies between 0.2 A and 1.2 A, the DC output voltage can be maintained constant at about 6 V if the switching frequency is varied between 115 kHz and 107 kHz. Also, a power transform efficiency as high as about 70% can be maintained.

Figure 8:
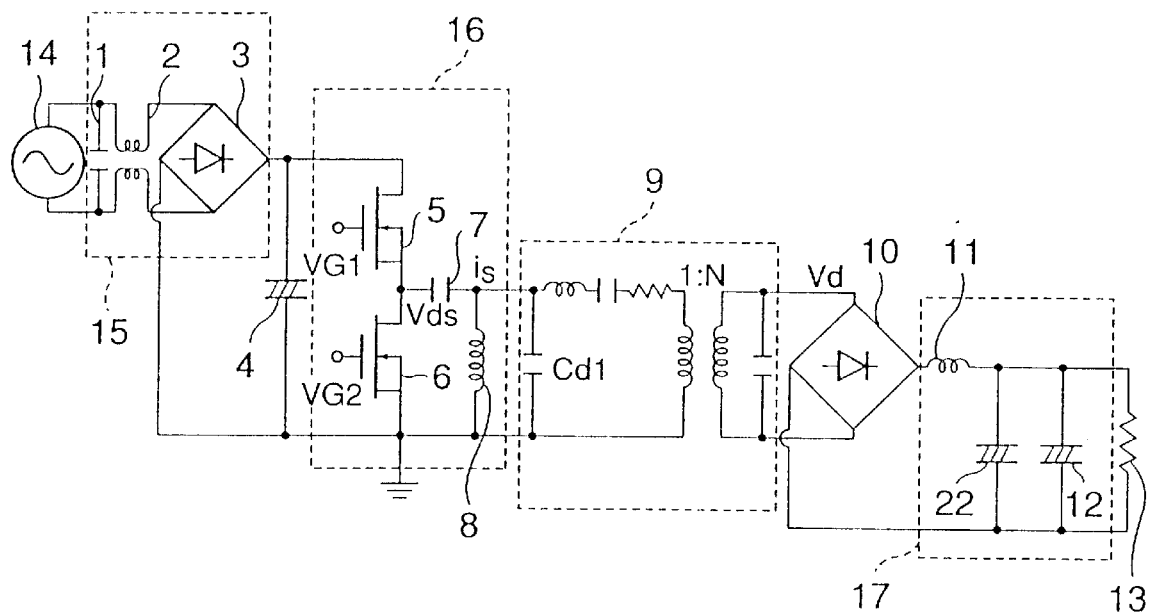
FIG. 8 is a circuit diagram showing the second embodiment of the present invention.
Figure 10:
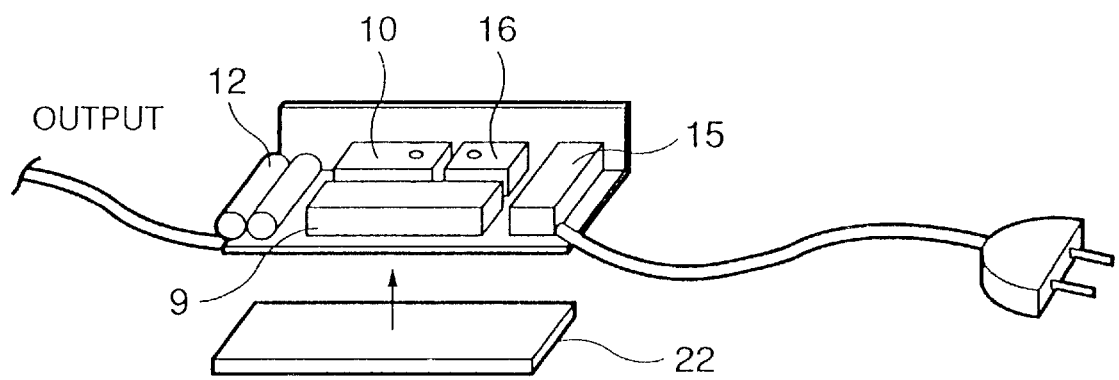
FIG. 10 is a perspective view showing an AC adapter implemented by the embodiment shown in FIG. 8.

FIG. 8 shows the second embodiment of the present invention while FIG. 10 shows an AC adapter implemented by the embodiment. In this embodiment, the input smoothing capacitor 4 (generally aluminum electrolytic capacitor) is implemented as a small capacity capacitor or is omitted. The output smoothing capacitor 12 is implemented by a large capacity capacitor, e.g., an electric double layer capacitor 22. With this configuration, the embodiment reduces ripples. The electric double layer capacitor 22 can be provided with a card-like structure as thin as 1 mm to 2 mm, further miniaturizing the AC/DC converter.

Figure 9:
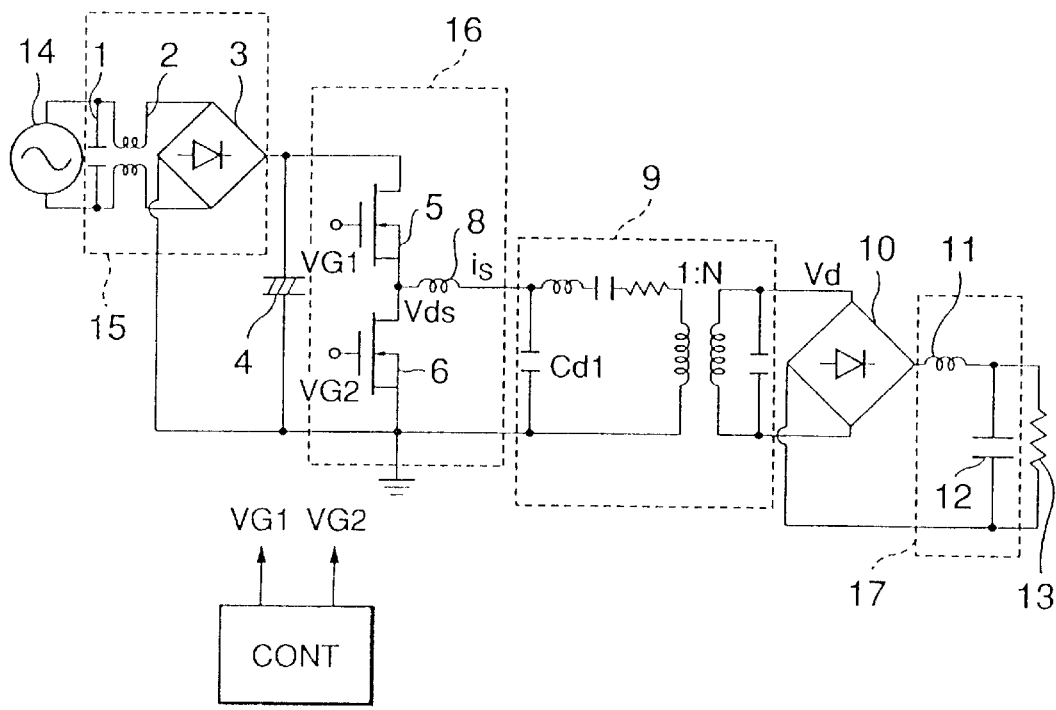
FIG. 9 is a circuit diagram showing the third embodiment of the present invention.

FIG. 9 is a circuit diagram showing the third embodiment of the present invention. In this circuit, a capacitor 7 is removed and instead an inductor 8 is inserted in series with the piezoelectric transformer. This circuit is good when the value of cd1 is large to reduce the current Is. The circuit operation is almost the same as that shown in FIG. 2.

While the above embodiments have concentrated on a piezoelectric transformer operable in the longitudinal vibration mode, use may be made of a piezoelectric transformer operable in any other suitable mode, e.g., a slip mode.

In summary, in accordance with the present invention, a switching regulator type AC/DC converter for transforming a commercial AC power source to a DC power source includes a transformer implemented by a piezoelectric transformer formed of ceramics which is incombustible and highly isolative. This, coupled with the fact that a piezoelectric transformer can have its input electrodes and output electrodes spaced by several millimeters due to its inherent structure, eliminates the need for a barrier gap, spacer or noninflammable tape essential with a conventional electromagnetic transformer. The transformer is therefore extremely small size and contributes to the miniaturization of the entire converter.

Further, the piezoelectric transformer is caused to operate in the longitudinal vibration mode which maximizes the length. This allows the operation frequency to be lowered while further reducing the overall size of the transformer.

What is claimed is:

1. A switching regulator type AC/DC step-down voltage converter for converting a commercial AC power source to a DC power source, comprising an input circuit for converting the AC power source to an input signal to a step-down piezoelectric transformer, and an output circuit for converting the piezoelectric transformer output signal to a substantially DC power supply, wherein said piezoelectric transformer includes an input section and an output section, each being implemented as a plurality of electrodes laminated in a lengthwise direction of said piezoelectric transformer and connected in parallel with each other, and wherein portions between said plurality of electrodes are polarized in the lengthwise direction, whereby said piezoelectric transformer is operable in a longitudinal vibration mode.

2. An AC/DC converter as claimed in claim 1, wherein the input circuit includes an input smoothing capacitor provided with a small capacity for rectifying and smoothing the commercial AC power source, and the output circuit includes an output smoothing capacitor provided with a great capacity for rectifying and smoothing a high frequency AC voltage output from the piezoelectric transformer.

3. An AC/DC converter as claimed in claim 1, wherein the output circuit includes an output smoothing capacitor with a great capacity for rectifying and smoothing a high frequency AC voltage output from said piezoelectric transformer.

4. An AC/DC converter as claimed in claim 1, further comprising control means for controlling a frequency of a high frequency AC voltage for exciting said piezoelectric transformer, such that a DC output voltage remains constant despite variations of a load.

5. An AC/DC converter as claimed in claim 1, wherein said piezoelectric transformer operates in the frequency bandwidth between 100 and 116 KHz.

6. An AC/DC converter as claimed in claim 1, wherein the AC/DC converter supplies an output current between 0.2 and 1.2 amperes.

7. An AC/DC converter as claimed in claim 1, wherein the AC/DC converter supplies an output voltage between 2 and 6 volts.

8. An AC/DC converter as claimed in claim 1, wherein the input circuit comprises an AC to DC rectifier, the output of which is coupled to a switching circuit, the output of which is coupled to the piezoelectric transformer.

9. An AC/DC converter as claimed in claim 8, wherein the input circuit further comprises an input filter, wherein the AC power source is coupled to the input filter, the output of which is coupled to the AC to DC rectifier.

10. An AC/DC converter as claimed in claim 1, wherein the output circuit comprises an AC to DC rectifier coupled to the output of the piezoelectric transformer.

11. An AC/DC converter as claimed in claim 10, wherein the output circuit further comprises an output filter coupled to the output of the AC to DC rectifier.

12. A switching regulator type AC/DC step-down voltage converter for converting a commercial AC power source to a DC power source, comprising an input circuit for converting the AC power source to an input signal to a step-down piezoelectric transformer, and an output circuit for converting the piezoelectric transformer output signal to a substantially DC power supply, wherein said piezoelectric transformer includes an input section and an output section, each being implemented as a plurality of electrodes laminated in a thicknesswise direction of said piezoelectric transformer and connected in parallel with each other, and wherein portions between said plurality of electrodes are polarized in a thicknesswise direction of said piezoelectric transformer, while a portion between said input section and said output section is polarized in a lengthwise direction of said piezoelectric transformer, whereby said piezoelectric transformer is operable in a transverse vibration mode for exciting lengthwise vibration based on thicknesswise vibration of input electrodes.

13. An AC/DC converter as claimed in claim 12, wherein the input circuit includes an input smoothing capacitor provided with a small capacity for rectifying and smoothing the commercial AC power source, and the output circuit includes an output smoothing capacitor provided with a great capacity for rectifying and smoothing a high frequency AC voltage output from the piezoelectric transformer.

14. An AC/DC converter as claimed in claim 12, wherein the output circuit includes an output smoothing capacitor with a great capacity for rectifying and smoothing a high frequency AC voltage output from said piezoelectric transformer.

15. An AC/DC converter as claimed in claim 12, further comprising control means for controlling a frequency of a high frequency AC voltage for exciting said piezoelectric transformer, such that a DC output voltage remains constant despite variations of a load.

16. An AC/DC converter as claimed in claim 12, wherein said piezoelectric transformer operates in the frequency bandwidth between 100 and 116 KHz.

17. An AC/DC converter as claimed in claim 12, wherein the AC/DC converter supplies an output current between 0.2 and 1.2 amperes.

18. An AC/DC converter as claimed in claim 12, wherein the AC/DC converter supplies an output voltage between 2 and 6 volts.

19. An AC/DC converter as claimed in claim 12, wherein the input circuit comprises an AC to DC rectifier, the output of which is coupled to a switching circuit, the output of which is coupled to the piezoelectric transformer.

20. An AC/DC converter as claimed in claim 19, wherein the input circuit further comprises an input filter, wherein the AC power source is coupled to the input filter, the output of which is coupled to the AC to DC rectifier.

21. An AC/DC converter as claimed in claim 12, wherein the output circuit comprises an AC to DC rectifier coupled to the output of the piezoelectric transformer.

22. An AC/DC converter as claimed in claim 21, wherein the output circuit further comprises an output filter coupled to the output of the AC to DC rectifier.

* * * * *